(12) United States Patent
Young et al.

(10) Patent No.: US 11,333,413 B2
(45) Date of Patent: May 17, 2022

(54) SOLID STATE COOLER DEVICE

(71) Applicants: Robert Miles Young, Ellicott City, MD (US); Aaron Ashley Hathaway, Baltimore, MD (US); John X. Przybysz, Severna Park, MD (US); Gregory R. Boyd, Washington, DC (US); Zachary A. Stegen, Baltimore, MD (US); Edward R. Engbrecht, Odenton, MD (US); Aaron A. Pesetski, Gambrills, MD (US); Marc Eisenzweig Sherwin, Catonsville, MD (US)

(72) Inventors: Robert Miles Young, Ellicott City, MD (US); Aaron Ashley Hathaway, Baltimore, MD (US); John X. Przybysz, Severna Park, MD (US); Gregory R. Boyd, Washington, DC (US); Zachary A. Stegen, Baltimore, MD (US); Edward R. Engbrecht, Odenton, MD (US); Aaron A. Pesetski, Gambrills, MD (US); Marc Eisenzweig Sherwin, Catonsville, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 344 days.

(21) Appl. No.: 16/554,203

(22) Filed: Aug. 28, 2019

(65) Prior Publication Data
US 2021/0063060 A1 Mar. 4, 2021

(51) Int. Cl.
F25B 21/00 (2006.01)
F25D 31/00 (2006.01)
(Continued)

(52) U.S. Cl.
CPC .............. F25B 21/00 (2013.01); F25D 31/00 (2013.01); H01L 39/06 (2013.01);
(Continued)

(58) Field of Classification Search
CPC ................ F25D 31/00; F25B 2321/003; F25B 2400/15; H01L 39/22; H01L 39/06589;
(Continued)

(56) References Cited

U.S. PATENT DOCUMENTS 6,581,387 B1 6/2003 Ullom
8,301,214 B1 * 10/2012 Tolpygo ................ H01L 39/223
505/190
(Continued)

FOREIGN PATENT DOCUMENTS

JP H1041558 A 2/1998
WO 2017115008 A1 7/2017

OTHER PUBLICATIONS

International Search Report for Application No. PCT/US2020/043394 dated Oct. 29, 2020.
(Continued)

Primary Examiner — Lionel Nouketcha
(74) Attorney, Agent, or Firm — Tarolli, Sundheim, Covell & Tummino LLP

(57) ABSTRACT

A solid state cooler device is provided that includes a substrate, a first and second conductive pad disposed on the substrate, a first and second superconductor pad each having a side with a plurality of conductive pad contact interfaces spaced apart from one another and being in contact with a surface of respective first and second conductive pads, and a first and second insulating layer disposed between respective first and second superconductor pads, and respective ends of a normal metal layer. A bias voltage is applied between one of a first conductive pad or first superconductor (Continued)

pad and one of the second conductive pad or the second superconductor pad to remove hot electrons from the normal metal layer, and the contact area of the plurality of first and second conductive pad contact interfaces inhibits the transfer of heat back to the first and second superconductor pads.

20 Claims, 6 Drawing Sheets

(51) Int. Cl.
  *H01L 39/06* (2006.01)
  *H01L 23/00* (2006.01)
(52) U.S. Cl.
  CPC ..... *F25B 2321/003* (2013.01); *F25B 2400/15* (2013.01); *H01L 24/81* (2013.01)
(58) Field of Classification Search
  CPC ............. H01L 23/5386; H01L 25/0657; H01L 2224/16145; H01L 23/3128; H01L 2224/8136
  See application file for complete search history.

(56) References Cited

U.S. PATENT DOCUMENTS

| | | | |
|---|---|---|---|
| 10,170,461 B2* | 1/2019 | Tseng | G01R 31/2607 |
| 2019/0296003 A1* | 9/2019 | Fogal | H01L 25/0657 |
| 2021/0066571 A1 | 3/2021 | Hathaway et al. | |

OTHER PUBLICATIONS

Herve Courtois et al: "High-performance electronic cooling with superconducting tunnel junctions", Comptes Rendus—Physique., vol. 17, No. 10, Dec. 1, 2016 (Dec. 1, 2016), pp. 1139-1145, XP055738239, FR ISSN: 1631-0705, DOI: 10.1016/j.crhy.2016.08.010 p. 1141, line 31—p. 1144, line 4; figure 2(d).
HQ Nguyen et al: "A robust platform cooled by superconducting electronic refrigerators", Appl. Phys. Lett. Appl. Phys. Lett, Jan. 1, 2015 (Jan. 1, 2015), pp. 12601-12601, XP055738241, Retrieved from the Internet: URL:https://aip.scitation.org/doi/pdf/10.1063/1.4905440 p. 1, right—hand column, line 8—p. 2, right-hand column, line 29; figure 1.
Nguyen HQ et al: "A cascade electronic refrigerator using superconducting tunnel junctions", arxiv.org, Cornell University Library, 201 Olin Library Cornell University Ithaca, NY 14853, May 3, 2016 (May 3, 2016), XP080699075, figure 1.
Ian Jasper Agulo et al: "Effective electron microrefrigeration by superconductor-insulator-normal metal tunnel junctions with advanced geometry of electrodes and normal metal traps; Effective electron microrefrigeration by SIN tunnel junctions with advanced geometry of electrodes and normal metal traps", Nanotechnology, Institute of Physics Publishing, GB, vol. 15, No. 4, Apr. 1, 2004 (Apr. 1, 2004), pp. S224-S228, XP020067898, ISSN: 0957-4484, DOI: 10.1088/0957-4484/15/4/020 figures 1,2.
Camarasa-Gomez M et al: "Superconducting cascade electron refrigerator", Applied Physics Letters, A I P Publishing LLC, US, vol. 104, No. 19, May 12, 2014 (May 12, 2014), XP012185456, ISSN: 0003-6951, DOI: 10.1063/1.4876478 [retrieved on Jan. 1, 1901] the whole document.
International Search Report for Application No. PCT/US2020/043398 dated Nov. 12, 2020.
Clark A M et al: "Practical electron-tunneling refrigerator", Applied Physics Letters, A I P Publishing LLC, US, vol. 84, No. 4, Jan. 26, 2004 (Jan. 26, 2004), pp. 625-627, XP012061945, ISSN: 0003-6951, DOI 10.1063/1.1644326 figure 1.
Leoni R et al: "Electron cooling by arrays of submicron tunnel junctions", Journal of Applied Physics, American Institute of Physics, US, vol. 85, No. 7, Apr. 1, 1999 (Apr. 1, 1999), pp. 3877-3881, XP012047026, ISSN: 0021-8979, DOI: 10.1063/1.369759 figures 2,3.
Prest M J et al: "Strain enhanced electron cooling in a degenerately doped semiconductor", Applied Physics Letters, A I P Publishing LLC, US, vol. 99, No. 25, Dec. 19, 2011 (Dec. 19, 2011), pp. 251908-251908, XP012152781, ISSN: 0003-6951, DOI: 10.1063/1.3670330 [retrieved on Dec. 22, 2011].
International Search Report for Application No. PCT/US2020/061700 dated Mar. 1, 2021.
Muhonen, et al.: "Micrometer-Scale Refrigerators"; (2012); Reports on progress in physics. Physical Society (Great Britain). 75. 046501. 10.1088/0034-4885/75/4/046501; found on the internet at: file:///C:/Users/lpringle/Downloads/Micrometre-scale_refrigerators.pdf on Aug. 28, 2019.
Nguyen, et al. 1: "A Cascade Electronic Refrigerator Using Superconducting Tunnel Junctions" (May 3, 2016); Phys. Rev. Applied 6, 054011 (2016); DOI: 10.1103/PhysRevApplied.6.054011; arXiv: 1605.00830 [cond-mat.mes-hall]; found on the internet at: https://arxiv.org/abs/1605.00830 on Aug. 28, 2019.
Nguyen, et al. 2: "Trapping Hot Quasi-Particles in a High-Power Superconducting Electronic Cooler"; New Journal of Physics. 15. 10.1088/1367-2630/15/8/065013; found on the internet at: https://www.researchgate.net/publication/236124442_Trapping_hot_quasi-particles_in_a_high-power_superconducting_electronic_cooler, on Aug. 28, 2019.
Quarnta O et al. "Cooling electrons from 1 K to 400 mK with V-based nanorefrigerators" arxiv.org, Cornell University Library, 201 Olin Library Cornell University Ithaca, NY 14853, Nov. 2, 2010, XP080460092, DOI: 10.1063/1.3544058, figure 1.
International Search Report for Application No. PCT/US2020/053789 dated Jan. 15, 2021.

* cited by examiner

SOLID STATE COOLER DEVICE

TECHNICAL FIELD

The present invention relates generally to refrigeration, and more particularly to a solid state cooler device.

BACKGROUND

Solid-state electron cooling by the tunneling of "hot" electrons across a normal metal-insulator-superconductor (NIS) junction, using a bias voltage, has been proven to work below 1 K, substantially operating like the more familiar near room-temperature expensive Peltier thermoelectric refrigerator. These NIS cryo-coolers are built from the same materials as Josephson junctions used in the superconducting circuitry and by the same lithography fabrication foundry tools, and are fundamentally completely compatible with the Josephson junction components. They could be integrated alongside the Josephson junctions themselves, fabricated concurrently. However, currently NIS coolers have a very limited temperature throw, with a maximum temperature difference between hot and cold sides of ~150 mK.

One of the main limitations to NIS coolers' full performance is the presence in the superconducting leads of non-equilibrium quasi-particles arising from the high current running through the device. The low quasi-particle relaxation rate and thermal conductivity in a superconductor bind these hot particles in the vicinity of the junction and lead to severe overheating in the superconducting electrodes. There are several methods for reducing the accumulation of quasi-particles in a superconductor. The most common method is to use a normal metal coupled to the superconductor referred to as a quasiparticle trap, such that quasi-particles migrate to the normal metal and relax their energy there through electron-electron and electron-phonon interaction. This device is referred to as a normal metal-insulator-superconductor-normal metal (NISN) junction. However, phonon heat generated in the quasiparticle trap can migrate back to the superconducting electrodes also limiting the temperature difference between the hot side and cold sides of the NISN junction solid state cooler.

SUMMARY

In one example, a solid state cooler device is provided that comprises a substrate, a first conductive pad disposed on the substrate, a second conductive pad disposed on the substrate and spaced apart from the first conductive pad by a gap. A first superconductor pad includes a first side, and a second side with a plurality of first conductive pad contact interfaces spaced apart from one another and being in contact with a surface of the first conductive pad. A second superconductor pad includes a first side, and a second side with a plurality of second conductive pad contact interfaces spaced apart from one another and being in contact with a surface of the second conductive pad. A first insulating layer is disposed between a surface of the first side of the first superconductor pad, and a first end of a normal metal layer, and a second insulating layer is disposed between a surface of the first side of the second superconductor pad, and a second end of a normal metal layer. A bias voltage is applied between one of a first conductive pad or first superconductor pad and one of the second conductive pad or the second superconductor pad to remove hot electrons from the normal metal layer, and the contact area of the plurality of first conductive pad contact interfaces and the plurality of first conductive pad contact interfaces inhibit the transfer of heat back to the first and second superconductor pads.

In yet another example, a refrigeration system is provided comprising a refrigeration container, and a plurality of solid state cooler devices disposed about the refrigeration container. Each of the solid state cooler devices comprises a substrate, a first conductive pad disposed on the substrate, a second conductive pad disposed on the substrate and spaced apart from the first conductive pad by a gap. A first superconductor pad includes a first side, and a second side with a plurality of first conductive pad contact interfaces spaced apart from one another and being in contact with a surface of the first conductive pad. A second superconductor pad includes a first side, and a second side with a plurality of second conductive pad contact interfaces spaced apart from one another and being in contact with a surface of the second conductive pad. A first insulating layer is disposed between a surface of the first side of the first superconductor pad, and a first end of a normal metal layer, and a second insulating layer is disposed between a surface of the first side of the second superconductor pad, and a second end of a normal metal layer. A bias voltage is applied between one of a first conductive pad or first superconductor pad and one of the second conductive pad or the second superconductor pad to remove hot electrons from the normal metal layer, and the contact area of the plurality of first conductive pad contact interfaces and the plurality of first conductive pad contact interfaces inhibit the transfer of heat back to the first and second superconductor pads.

DETAILED DESCRIPTION

The disclosure relates to a solid state cooler device and a refrigeration system including a refrigeration container and a plurality of solid state cooler devices disposed about the refrigeration container. The solid state cooler devices can form a last refrigeration stage in a plurality of refrigeration stages to provide cooling down to milliKelvin temperatures. The solid state cooler can be a NIS or a NISN device in which the contact area between superconductor pads and coupled associated conductive pads is reduced by employing conductive pad contact interfaces that couple the superconductor pads to the conductive pads. The conductive pads can be formed of a normal metal or a superconducting metal. The conductive pads function as a quasiparticle trap when the conductive pads are formed of a normal metal. A normal metal is a metal that does not superconduct at cryogenic operational device temperatures.

It is appreciated that large area geometry contact between the superconductor pads and the coupled conductive pads allow hot phonons to leak back into the superconductor and normal metal layer, greatly limiting performance of the solid state cooler device. The altering of the geometry and reduction of the contact area utilizes the thermal boundary resistance (TBR) that exists between a superconductor pad and the conductive pad, and thus reduces that backwards leakage of heat from the conductive pad back to the superconductor pad. This allows the rejection temperature to be raised beyond conventional NIS or NISN coolers by reducing the backward leakage of heat from the hot rejection side while not impeding the heat lifting of quasi-particles when the conductive pad functions as a quasi-particle trap.

In one example, solid-state refrigeration using tunneling electrons can be improved by reduction in surface contact area between superconductor pads and underlying conductive pads. This reduction can be achieved through geometric shaping of the metal layers, for example, into frustum structures. The resultant interfacial boundary resistance will cause a temperature jump to increase the temperature throw (cold to hot) and raise the efficiency. The reduced contact area between the superconductor pad and the conductive pad can also be achieved through the use of bump bonds which are either fabricated from a superconducting metal and/or a normal metal. These bump bonds serve to create a reduction of the surface area in contact between the superconductor of the NIS junction and the conductive pad. Furthermore, etched contacts on the superconductor pads can also serve to reduce contact surface area and thus mitigate the migration of hot phonons back to the superconductor pads.

Figure 1:
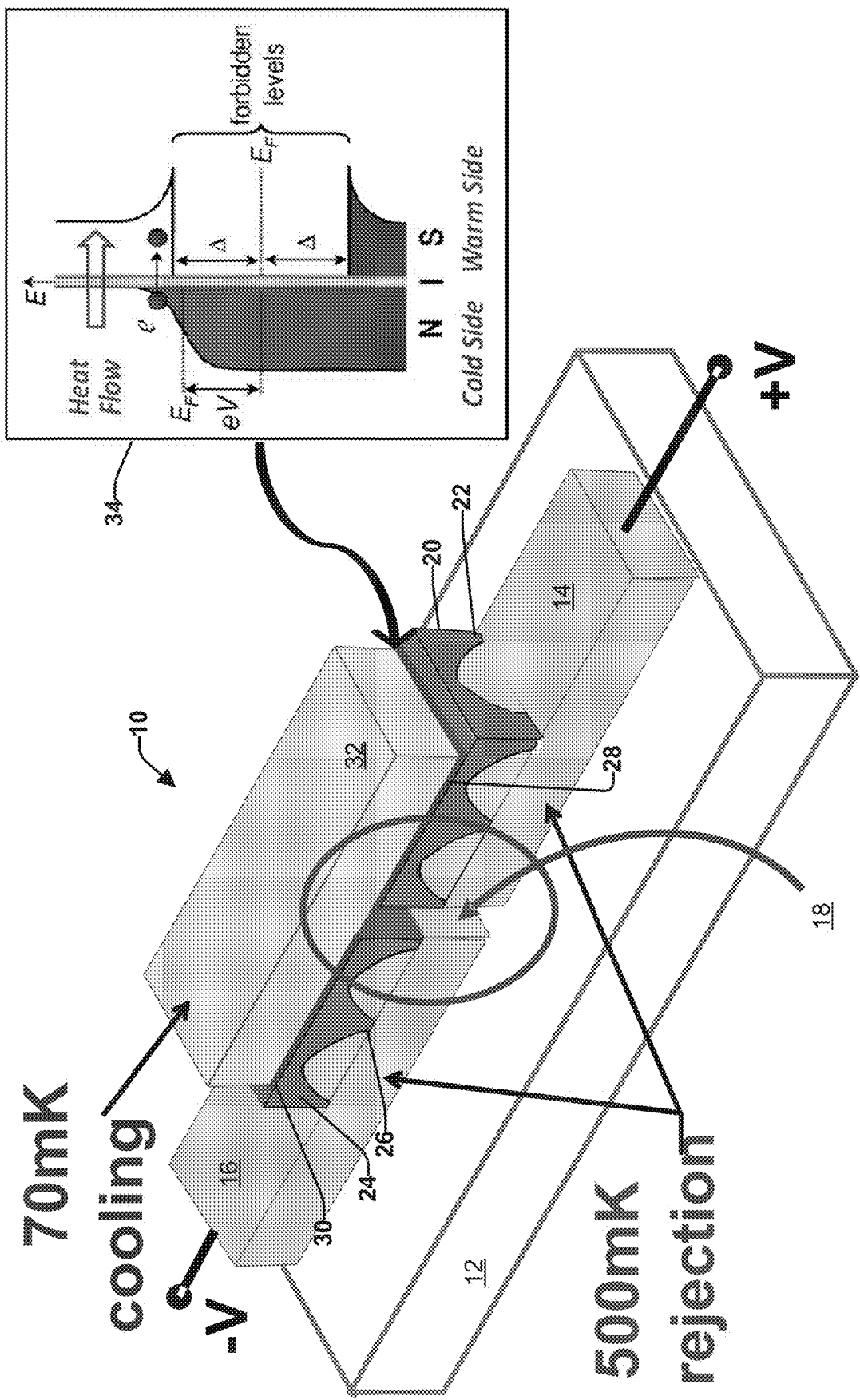
FIG. 1 illustrates a perspective view of a solid state cooler device.

FIG. 1 illustrates a perspective view of an example of a solid state cooler device 10. The solid state cooler device 10 can be configured as a refrigeration stage employed in a cryogenic cooling application in which the solid state structure is one of a plurality of solid state cooler devices disposed about a refrigeration container that resides in a vacuum and holds superconducting circuitry. The plurality of solid state structures can provide the final stage in a cryogenic refrigeration system, and allow for efficient cooling by removal of heat from a cold side of the refrigeration stage, and prevent the return of heat from the hot side of the last refrigeration stage within a plurality of refrigeration stages. The solid state cooler device can include a NIS junction or a NISN junction. The return of heat extracted from the cold side of the solid state cooler device is mitigated by a reduction of the hot side contact area between the contact surface of the superconductor pads and the adjacent contact surface layer of conductive pads on the hot side of the solid state cooler device. This is achieved through geometric shaping of hot side contact area of the superconductor pads.

For example, the hot side contact area (or second side) can be micromachined to form frustum structures that extend to form conductive pad contact interfaces on the smaller diameter portion of the frustum structure. The conductive pads can be formed of a normal metal or a superconducting metal. In one example, the conductive pads are formed of a normal metal and function as a quasi-particle trap, while the reduced contact area of the conductive pad contact interfaces reduce the backward leakage of heat from the hot rejection side while not impeding the heat lifting of quasi-particles by the quasi-particle trap.

As illustrated in FIG. 1, the solid state cooler device 10 includes a substrate 12 that is disposed on a hot side of a refrigeration stage. A first conductive pad 14 is disposed on the substrate 12, and a second conductive pad 16 is disposed on the substrate 12. The first conductive pad 14 is spaced apart from the second conductive pad 16 by a gap 18. A first superconductor pad 20 includes a first side (or cold side) configured to face the cold side of the refrigerator stage and a second side (or hot side) configured to face the hot side of the refrigeration stage. The second side of first superconductor pad 20 is fabricated with a plurality of first conductive pad contact interfaces 22 spaced apart from one another and being disposed in contact with a surface of the first conductive pad 14. A second superconductor pad 24 includes a first side facing the cold side of the refrigeration stage, and a second side facing the hot side of the refrigeration stage. The second side of the second superconductor pad 24 is fabricated with a plurality of second conductive pad contact interfaces 26 spaced apart from one another and being disposed in contact with a surface of the second conductive pad 16.

A first insulating layer 28 is disposed between a surface of the first side of the first superconductor pad 20, and a first end of a normal metal layer 32, and a second insulating layer 30 is disposed between a surface of the first side of the second superconductor pad 30, and a second end of the normal metal layer 32. A bias voltage is applied between one of a first conductive pad 14 or first superconductor pad 20 and one of the second conductive pad 16 or the second superconductor pad 24 to remove hot electrons from the normal metal layer 32. The bias voltage raises the energy level of the hot electrons on the normal metal layer 32. A graph 34 illustrates the principle of operation, where hot electrons above the Fermi level tunnel across the insulating layers 28 and 30 into the superconductor pads 20 and 24, respectively, thus removing heat from the normal metal layer 32. The use of the plurality of first conductive pad contact interfaces 22, and the plurality of second conductive pad contact interfaces 26 provides for a reduction of temperature and an increase delta temperature between the hot side and cold side of the solid state cooler device 10 relative to conventional devices.

The first conductive pad 14 and the second conductive pad 16 can be formed from a normal metal or a superconducting metal. The first conductive pad 14 and the second conductive pad 16 act as a quasi-particle trap when formed of a normal metal. A reduction in contact area employing the plurality of first conductive pad contact interfaces 22 and the plurality of second conductive pad contact interfaces 26 inhibits the transfer of heat back to the normal metal layer 32, an thus enables a higher rejection temperature. This is accomplished by reducing the contact area in which hot phonons can transfer back to the superconducting contact pads 20 and 24, and thus, increasing the temperature delta between the cold side and the hot side of the solid state cooler device 10. As shown in FIG. 1, the plurality of first conductive pad contact interfaces 22 and the plurality of second conductive pad contact interfaces 26 are formed from a smaller diameter portion of frustum structures on both the first superconductor pad 20 and the second superconductor pad 24. However, other structures can be employed to form a reduced contact area between the first and second superconductor pads 20 and 24, and the respective first and second conductive pads 14 an 16.

The normal metal layer 32 can be formed of a normal metal such as gold, platinum, or a metal that is above its superconducting transition temperature, such as titanium or chromium, or a combination thereof. The first and second superconductor pads 20 and 24 can be formed of indium, niobium, aluminum, or some other superconducting metal.

Figure 2:
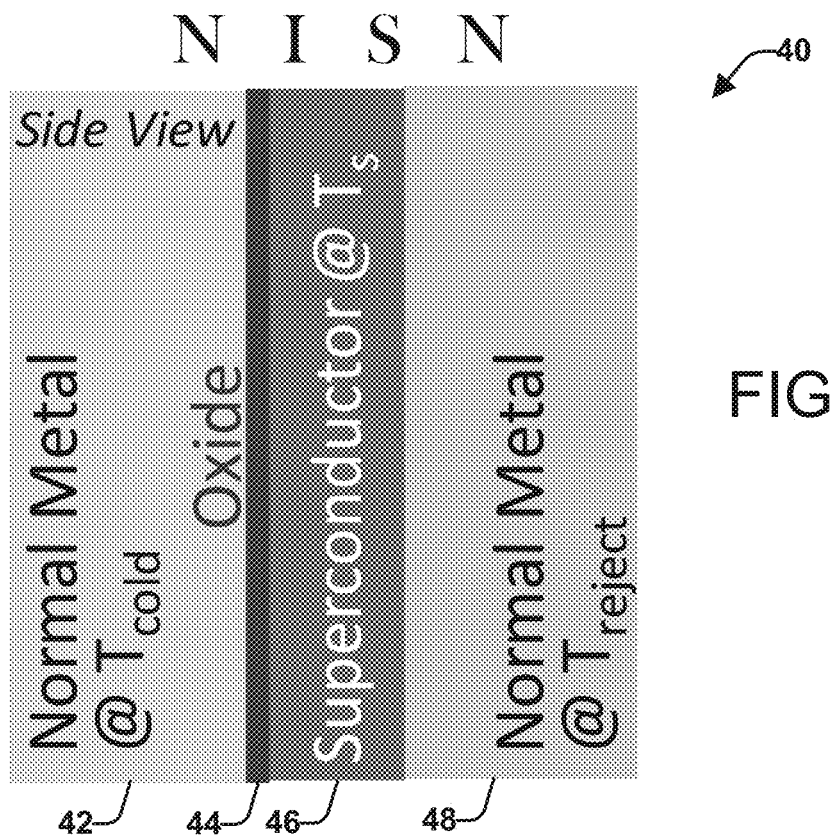
FIG. 2 illustrates a schematic illustration of a side-view of a portion of a cross-section for a conventional cooler formed from a NISN device.
Figure 3:
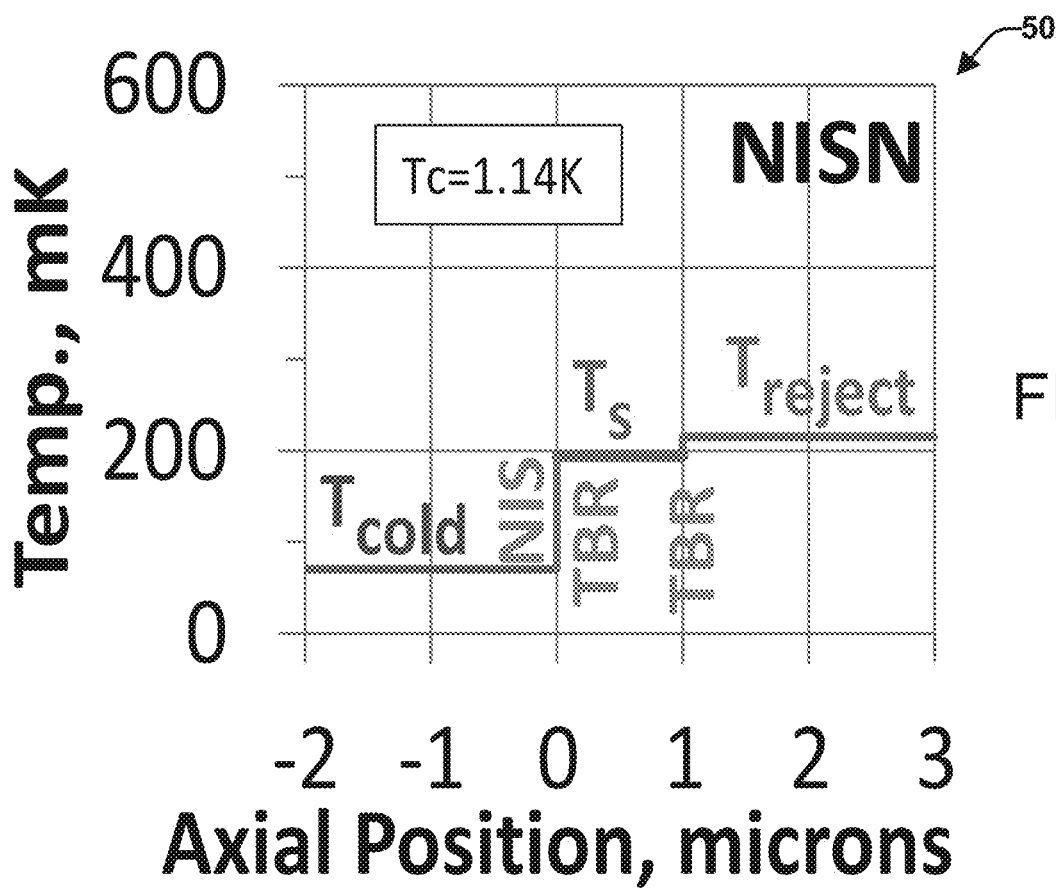
FIG. 3 illustrates a graph of axial position (microns) of the cooler of FIG. 2 versus temperature (millikelvin (mK)) over the axial positions.

FIG. 2 illustrates a schematic illustration of a side-view of a portion of a cross-section for a conventional cooler formed from a NISN device 40. The NISN device includes a first normal metal layer 42 spaced apart from a first side of a superconducting layer 46 by an insulating layer 44. The first normal metal layer 42 resides at a temperature of Tcold, while the superconducting layer 48 resides at a temperature of $T_S$. A second normal metal layer 48 functions as a quasi-particle trap that resides on a second side of the superconducting layer 46. The quasi-particle trap resides at a rejection temperature Treject. FIG. 3 illustrates a graph 50 of axial position (microns) of the cooler 40 of FIG. 2 versus temperature (millikelvin (mK)) over the axial positions. As shown in FIG. 3, the temperature of the first normal metal layer 42 is slightly below 100 mK, while the temperature of superconducting layer 46 is at about 200 mK. The second normal metal layer 48 resides just above 200 mK, such that a temperature delta between the superconducting layer 46 and the second normal metal layer 48 is very small providing for a small rejection temperature.

Figure 4:
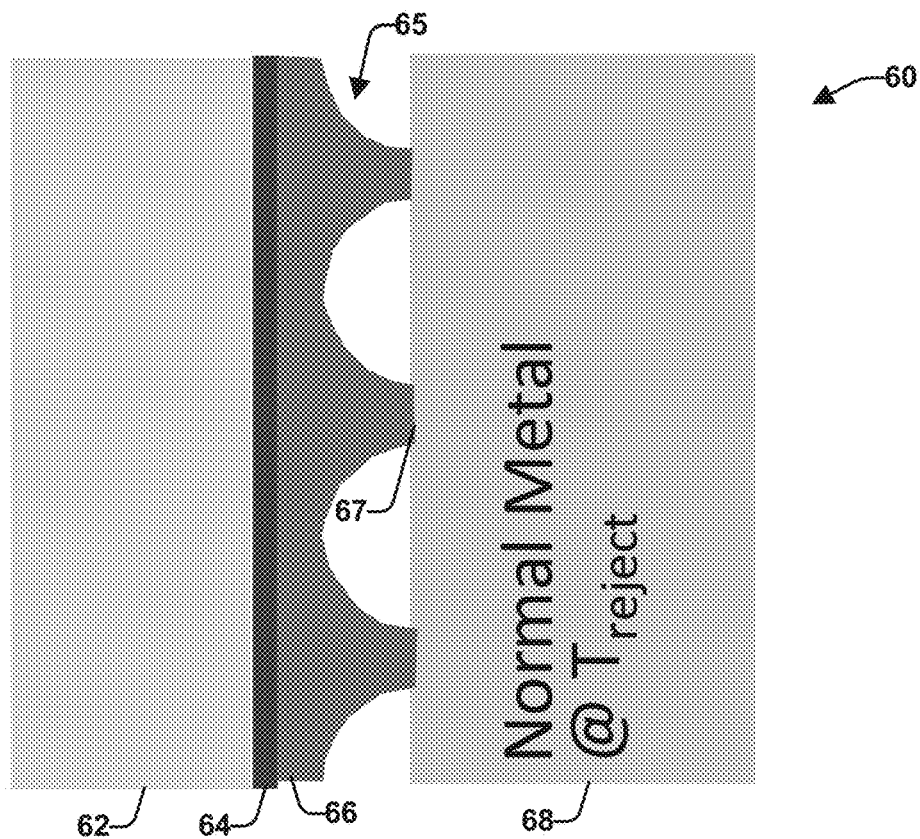
FIG. 4 illustrates a schematic illustration of a side-view of a portion of a cross-section for an example cooler formed from a NISN device.
Figure 5:
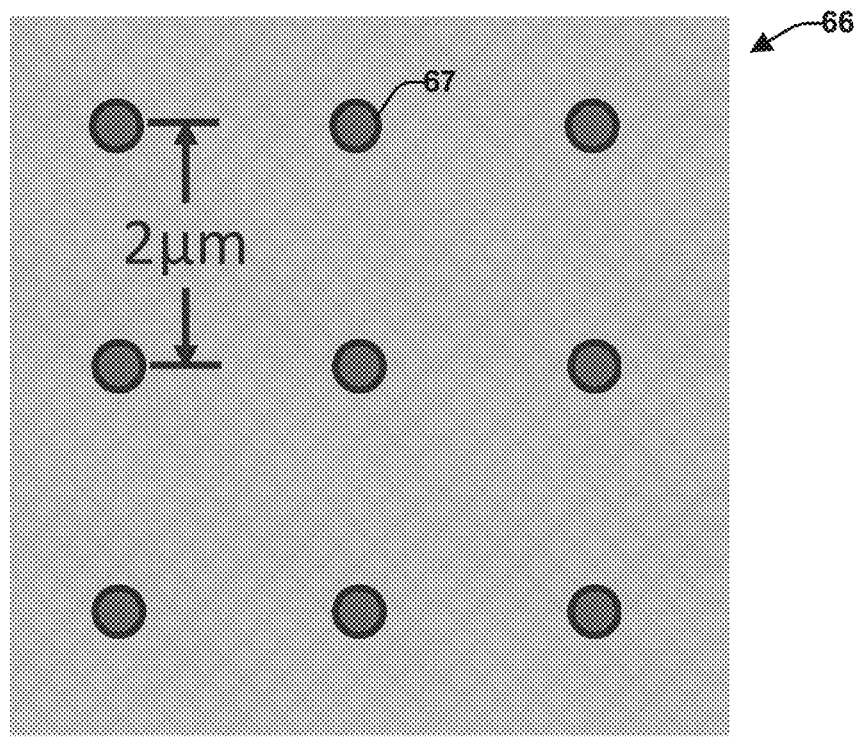
FIG. 5 illustrates a plan view of the second side of the superconducting layer with the conductive pad contact interfaces.

FIG. 4 illustrates a schematic illustration of a side-view of a portion of a cross-section for an example cooler formed from a NISN device 60 that employs conductive pad contact interfaces formed from a smaller diameter portion of frustum structures similar as those illustrated in FIG. 1. The NISN device includes a first normal metal layer 62 spaced apart from a first side of a superconducting layer 66 by an insulating layer 64. The first normal metal layer 62 resides at a temperature of Tcold, while the superconducting layer 66 resides at a temperature of $T_S$. A second normal metal layer 68 functions as a quasi-particle trap that resides on a second side of the superconducting layer 66. The quasi-particle trap resides at a rejection temperature Treject. The second side of the superconducting layer 66 includes conductive pad contact interfaces 67 formed from a smaller diameter portion of frustum structures 65. FIG. 5 illustrates a plan view of the second side of the superconducting layer 66 with the conductive pad contact interfaces 67 spaced apart from one another by about 2 micrometers.

Figure 6:
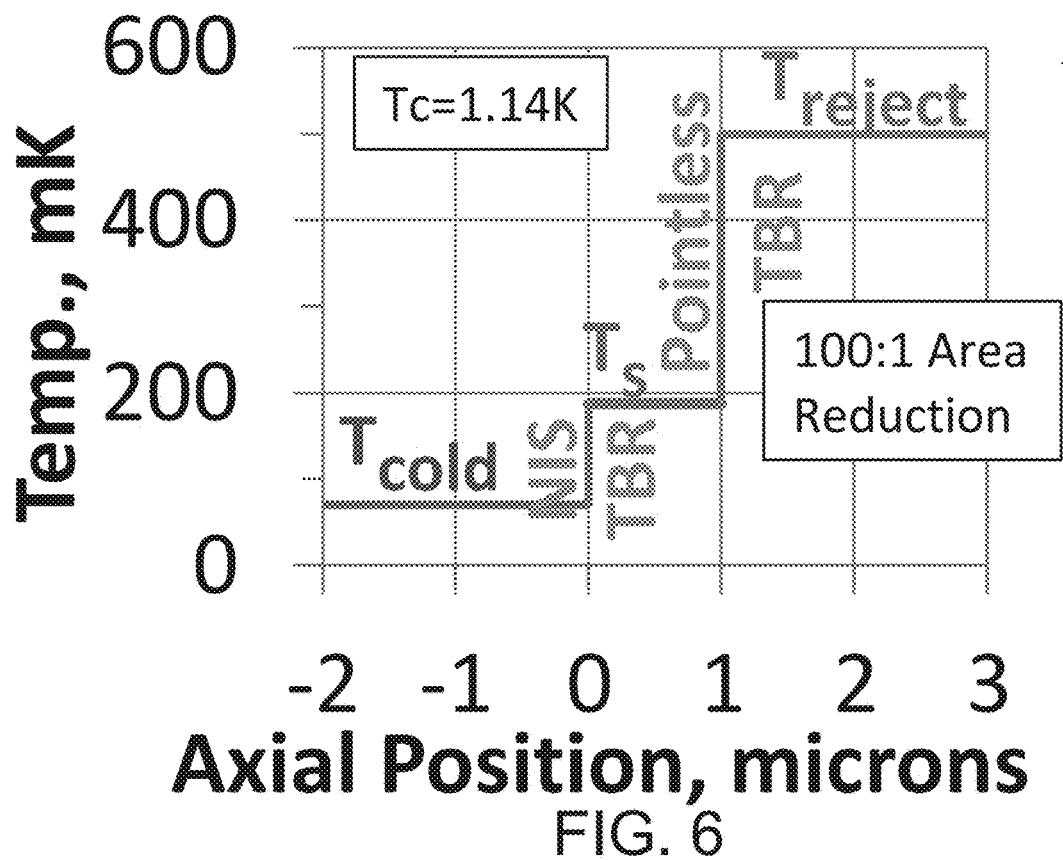
FIG. 6 illustrates a graph of axial position (microns) of the cooler of FIGS. 4-5 versus temperature (millikelvin (mK)) over the axial positions.

FIG. 6 illustrates a graph 70 of axial position (microns) of the cooler 60 of FIGS. 4-5 versus temperature (millikelvin (mK)) over the axial positions. As shown in FIG. 6, the temperature of the first normal metal layer 62 is slightly below 100 mK, while the temperature of superconducting layer 66 is at about 200 mK. The second normal metal layer 68 resides just above 500 mK, such that a temperature delta between the superconducting layer 66 and the second normal metal layer 68 is much larger providing for a substantially larger rejection temperature that the device of FIG. 3. This is due to a 100:1 reduction in contact area between the superconducting layer 66 and the second normal metal layer 68 of the device of FIG. 4 versus the contact area of the superconducting layer 46 and the second normal metal layer 48 of FIG. 2.

It is to be appreciated that the insulator in a NIS or NISN device facilitates controlled band gaps between the normal metal and superconductor material since the band gaps can vary at the interface of the two materials. This insulator also hinders the return of heat back to the normal metal from the superconductor metal due to the hindering of the return of back to the cold normal metal. In one NISIN example as shown in FIG. 7, the conductive pad contact interfaces are formed of an insulator material and perform a similar function as does the insulator in the NIS or NISN evics to control the band gaps of the superconductor layer and the adjoining normal metal layer that functions as a quasi-particle trap.

Figure 7:
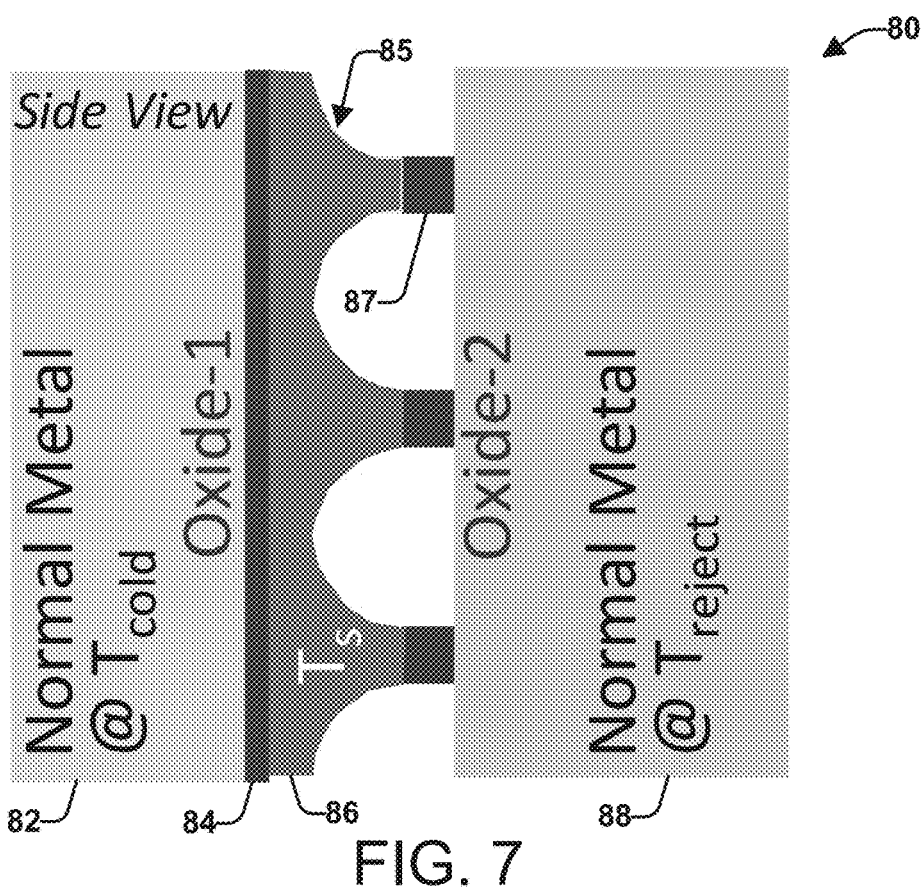
FIG. 7 illustrates a schematic illustration of a side-view of a portion of a cross-section for another example cooler formed from a NISN device.

FIG. 7 illustrates a schematic illustration of a side-view of a portion of a cross-section for an example cooler formed from a NISIN device 80 that employs conductive pad contact interfaces formed from a smaller diameter portion of frustum structures similar as those illustrated in FIG. 1. The NISIN device includes a first normal metal layer 82 spaced apart from a first side of a superconducting layer 86 by an insulating layer 84. A second normal metal layer 88 functions as a quasi-particle trap that resides on a second side of the superconducting layer 86. The second side of the superconducting layer 86 includes conductive pad contact interfaces 87 formed from a smaller diameter portion of frustum structures 85. The conductive pad contact interfaces 87 are formed of an insulator material to isolate the superconducting layer 86 and the second normal metal layer 88 as to provide controlled bandgaps between the two materials.

As previously discussed, the conductive pad contact interfaces formed from a smaller diameter portion of frustum structures provide for a smaller contact area between the superconductor layer or pad and the adjoining conductive layer or pad, and as a result provide an increased rejection temperature over conventional solid state coolers. This can also be achieved through the use of bump bonds which is either fabricated from a superconducting metal and/or a normal metal. Further the bumps do not need to be shaped using microfabrication techniques to create frustrums as depicted in FIG. 1. Instead the bumps are formed using a standard liftoff process or through etching. The efficiency of NISN solid state refrigeration is achieved through reduction in the surface area of the superconducting material in contact with the normal metal trap. This bump bond serves to create a reduction of the surface area in contact between the superconductor of the NIS junction and the normal metal trap. If the superconductor has a coherence length that is larger than the thickness that it will be fabricated at there is the possibility that it will be inverse-proximitized by the normal metal trap. This is prevented through the use of a superconducting bump bond.

Figure 8:
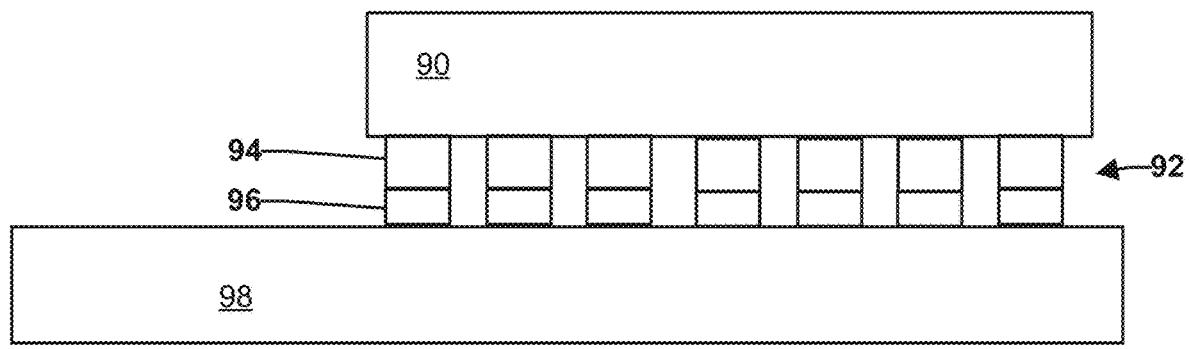
FIG. 8 illustrates a cross-sectional scematic diagram of an example portion of a solid state cooler.
Figure 9:
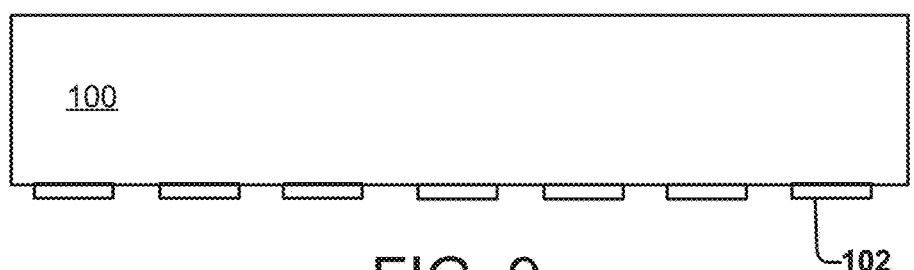
FIG. 9 illustrates a cross-sectional scematic diagram of example conductive contacts formed on a second side of a superconductor layer.
Figure 10:
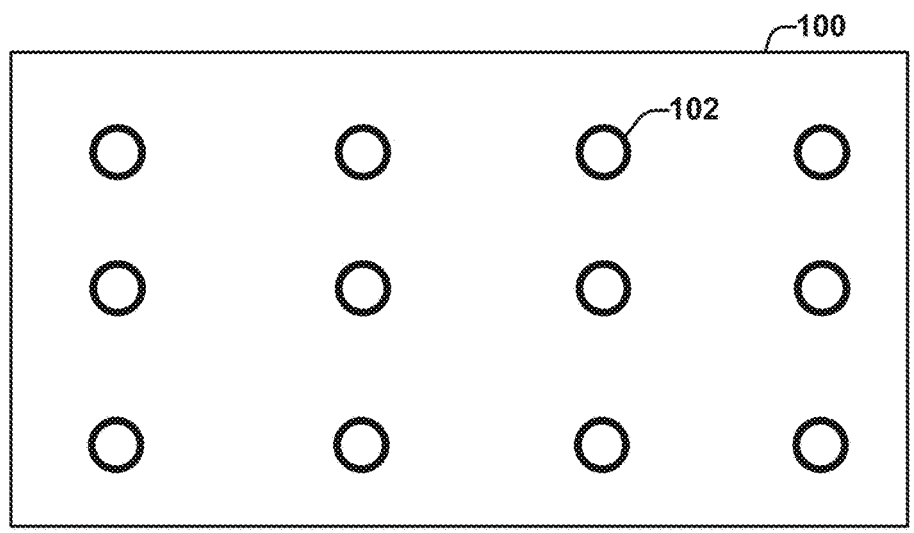
FIG. 10 illustrates a bottom view of the second side of a superconductor layer of FIG. 9.

FIG. 8 illustrates a cross-sectional scematic diagram of an example portion of a solid state cooler. A superconductor layer 90 and an underlying conductive layer are coupled to one another through a plurality of bump bonds 92. The bump bonds 92 reduce the contact surface area between the two layers. In one example, the conductive layer 98 is a normal metal that functions as a quasi-particle trap and the bump bonds 92 can be formed of one or more superconductor portions 94 and one or more normal metal portions 96. The bump bonds 92 are formed using a standard liftoff process or through etching. Other types of connections could be employed such as conductive contacts. FIG. 9 illustrates a cross-sectional scematic diagram of conductive contacts 102 formed on a second side of a superconductor layer 100 that would interface with an adjacent conductive layer, such as a normal metal layer that functions as a quasi-particle trap in a solid state cooler as previously discussed. FIG. 10 illustrates a bottom view of the second side of a superconductor layer of FIG. 9. The conductive contacts can be etched from a metal layer of formed from a photoresist liftoff process. The contacts should be thick enough to isolate the superconductor layer 100 from the adjacent conductive layer in the non-contact areas.

Figure 11:
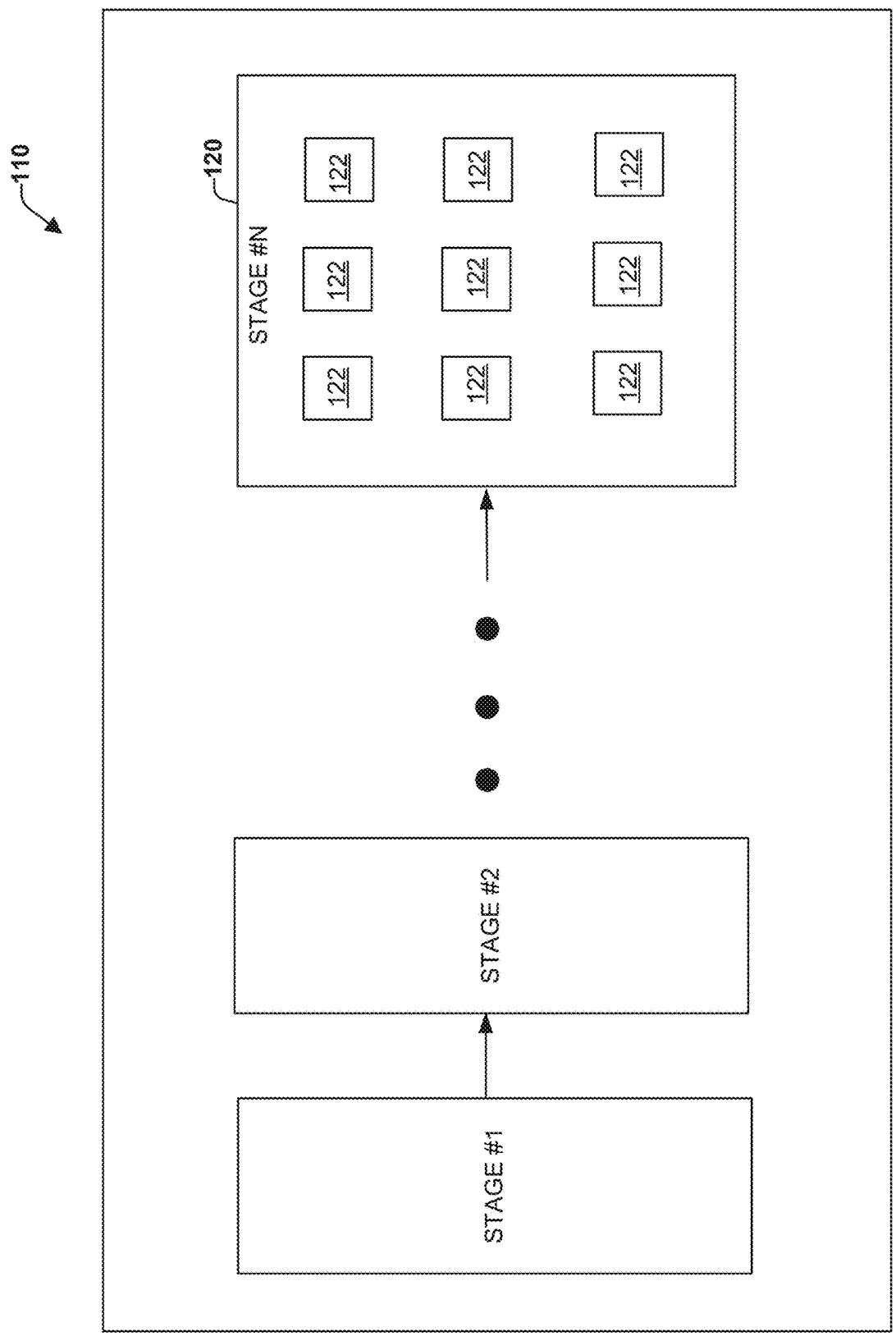
FIG. 11 illustrates a block diagram of a refrigeration system that employs solid state devices such as the solid state device of FIG. 1.

FIG. 11 illustrates a block diagram of a refrigeration system 110 that employs solid state devices such as the solid state device 10 of FIG. 1. The refrigeration system 10 includes a plurality of stages labeled stage #1 to stage #N, where N is an integer greater than or equal to 2. Each refrigeration stage provides an additional temperature drop from the previous stage, such that the Nth stage is the final stage and provides the last temperature drop and lowest temperature of the refrigeration system 110. In other examples, the Nth stage is a first or intermediary stage as opposed to the last stage. Stage #N in the refrigeration system 110 includes a refrigeration container 120 with a plurality of solid state devices 122 similar to that illustrated in FIG. 1 disposed about the container and cooperating to provide the final lowest temperature of the refrigeration system 110 within the container 120. The container 120 can be in a vacuum environment and be configured to house superconducting circuitry. In another example, one or more of the other stages employ solid state devices similar to those in stage #N to provide incremental temperature drops across the refrigeration system 110. In other examples, the refrigeration container 120 can be formed of a normal metal that provides the final normal metal layer of each solid state device 122.

Described above are examples of the subject disclosure. It is, of course, not possible to describe every conceivable combination of components or methodologies for purposes of describing the subject disclosure, but one of ordinary skill in the art may recognize that many further combinations and permutations of the subject disclosure are possible. Accordingly, the subject disclosure is intended to embrace all such alterations, modifications and variations that fall within the spirit and scope of the appended claims. In addition, where the disclosure or claims recite "a," "an," "a first," or "another" element, or the equivalent thereof, it should be interpreted to include one or more than one such element, neither requiring nor excluding two or more such elements. Furthermore, to the extent that the term "includes" is used in either the detailed description or the claims, such term is intended to be inclusive in a manner similar to the term "comprising" as "comprising" is interpreted when employed as a transitional word in a claim. Finally, the term "based on" is interpreted to mean at least based in part.

What is claimed is:

1. A solid state cooler device comprising:
a substrate;
a first conductive pad disposed on the substrate;
a second conductive pad disposed on the substrate and spaced apart from the first conductive pad by a gap;
a first superconductor pad having a first side, and a second side with a plurality of first conductive pad contact interfaces spaced apart from one another and being in contact with a surface of the first conductive pad;
a second superconductor pad having a first side, and a second side with a plurality of second conductive pad contact interfaces spaced apart from one another and being in contact with a surface of the second conductive pad;
a first insulating layer disposed between a surface of the first side of the first superconductor pad, and a first end of a normal metal layer;
a second insulating layer disposed between a surface of the first side of the second superconductor pad, and a second end of the normal metal layer; and
wherein a bias voltage applied between one of the first conductive pad or the first superconductor pad and one of the second conductive pad or the second superconductor pad removes hot electrons from the normal metal layer, and the contact area of the plurality of first conductive pad contact interfaces and the plurality of second conductive pad contact interfaces inhibits the transfer of heat back to the first and second superconductor pads.

2. The solid state cooler device of claim 1, wherein each the first conductive pad and the second conductive pad are formed of a normal metal and function as quasi-particle traps.

3. The solid state cooler device of claim 1, wherein each the first conductive pad and the second conductive pad are formed of a superconducting metal.

4. The solid state cooler device of claim 1, wherein the second side of the first superconductor pad includes a plurality of first frustum structures with each having a small diameter end that forms a respective first conductive pad contact interface of the plurality of first conductive pad contact interfaces, and the second side of the second superconductor pad includes a plurality of frustum structures with each having a small diameter end that forms a respective second conductive pad contact interface of the plurality of second conductive pad contact interfaces.

5. The solid state cooler device of claim 4, wherein each of the plurality of first conductive pad contact interfaces and the plurality of second conductive pad contact interfaces include an insulated end.

6. The solid state cooler device of claim 1, wherein the plurality of first conductive pad contact interfaces are formed from ends of a plurality of first bump bond structures that couple the second side of the first superconductor pad to the first conductive pad, and the plurality of second conductive pad contact interfaces are formed from ends of a plurality of second bump bond structures that couple the second side of the second superconductor pad to the second conductive pad.

7. The solid state cooler device of claim 1, wherein the plurality of first conductive pad contact interfaces are formed from a plurality of first conductive contacts that couple the second side of the first superconductor pad to the first conductive pad, and the plurality of second conductive pad contact interfaces are formed from a plurality of second conductive contacts that couple the second side of the second superconductor pad to the second conductive pad.

8. The solid state cooler device of claim 1, wherein each of the plurality of first conductive pad contact interfaces and the plurality of second conductive pad contact interfaces include an insulated end.

9. The solid state cooler device of claim 1, wherein each of the first superconductor pad and the second superconductor pad are formed from one of indium, niobium and aluminum.

10. The solid state cooler device of claim 1, wherein the normal metal layer is formed from one of gold, titanium, chromium, platinum, or a combination thereof.

11. A refrigeration system comprising a plurality of refrigeration stages, wherein a last stage comprises a refrigeration container and a plurality of solid state cooler devices as claimed in claim 1 disposed about the refrigeration container.

12. A refrigeration system comprising:
a refrigeration container;
a plurality of solid state cooler devices disposed about the refrigeration container wherein each of the solid state cooler devices comprises:
a substrate;
a first conductive pad disposed on the substrate;
a second conductive pad disposed on the substrate and spaced apart from the first conductive pad by a gap;
a first superconductor pad having a first side, and a second side with a plurality of first conductive pad contact interfaces spaced apart from one another and being in contact with a surface of the first conductive pad;
a second superconductor pad having a first side, and a second side with a plurality of second conductive pad contact interfaces spaced apart from one another and being in contact with a surface of the second conductive pad;
a first insulating layer disposed between a surface of the first side of the first superconductor pad, and a first end of a normal metal layer;
a second insulating layer disposed between a surface of the first side of the second superconductor pad, and a second end of the normal metal layer; and
wherein a bias voltage applied between one of the first conductive pad or the first superconductor pad and one of the second conductive pad or the second superconductor pad removes hot electrons from the normal metal layer, and the contact area of the plurality of first conductive pad contact interfaces and the plurality of second conductive pad contact interfaces inhibits the transfer of heat back to the first and second superconductor pads.

13. The refrigeration system of claim 12, wherein each the first conductive pad and the second conductive pad are formed of a normal metal and function as quasi-particle traps.

14. The refrigeration system of claim 12, wherein each the first conductive pad and the second conductive pad are formed of a superconducting metal.

15. The refrigeration system of claim 12, wherein the second side of the first superconductor pad includes a plurality of first frustum structures with each having a small diameter end that forms a respective first conductive pad contact interface of the plurality of first conductive pad contact interfaces, and the second side of the second superconductor pad includes a plurality of frustum structures with each having a small diameter end that forms a respective second conductive pad contact interface of the plurality of second conductive pad contact interfaces.

16. The refrigeration system of claim 15, wherein each of the plurality of first conductive pad contact interfaces and the plurality of second conductive pad contact interfaces include an insulated end.

17. The refrigeration system of claim 12, wherein the plurality of first conductive pad contact interfaces are formed from ends of a plurality of first bump bond structures that couple the second side of the first superconductor pad to the first normal metal pad, and the plurality of second conductive pad contact interfaces are formed from ends of a plurality of second bump bond structures that couple the second side of the second superconductor pad to the second normal metal pad.

18. The refrigeration system of claim 12, wherein the plurality of first conductive pad contact interfaces are formed from a plurality of first conductive contacts that couple the second side of the first superconductor pad to the first conductive pad, and the plurality of second conductive pad contact interfaces are formed from a plurality of second conductive contacts that couple the second side of the second superconductor pad to the second conductive pad.

19. The refrigeration system of claim 12, wherein each of the plurality of first conductive pad contact interfaces and the plurality of second conductive pad contact interfaces include an insulated end.

20. The refrigeration system of claim 12, wherein the refrigeration container; and the plurality of solid state cooler devices form one refrigeration stage of a plurality of refrigeration stages.

* * * * *